United States Patent
Sudo et al.

(10) Patent No.: US 9,347,148 B2
(45) Date of Patent: May 24, 2016

(54) VITREOUS SILICA CRUCIBLE WITH SPECIFIC RATIO OF TRANSPARENT LAYER AND BUBBLE-CONTAINING LAYER THICKNESSES

(75) Inventors: Toshiaki Sudo, Akita (JP); Ken Kitahara, Akita (JP); Koichi Suzuki, Akita (JP); Shinsuke Yamazaki, Akita (JP)

(73) Assignee: SUMCO CORPORATION, Tokyo (JP)

(*) Notice: Subject to any disclaimer, the term of this patent is extended or adjusted under 35 U.S.C. 154(b) by 550 days.

(21) Appl. No.: 13/308,250

(22) Filed: Nov. 30, 2011

(65) Prior Publication Data

US 2012/0137963 A1 Jun. 7, 2012

(30) Foreign Application Priority Data

Dec. 1, 2010 (JP) .................................. 2010-268841

(51) Int. Cl.
  *C30B 15/10* (2006.01)
(52) U.S. Cl.
  CPC ........... *C30B 15/10* (2013.01); *Y10T 117/1032* (2015.01)
(58) Field of Classification Search
  CPC ........ C30B 15/00; C30B 15/10; C30B 35/00; C30B 35/002; Y10T 117/00; Y10T 117/10; Y10T 117/1024; Y10T 117/1032; Y10T 117/1052; F27B 14/00; F27B 14/08; F27B 14/10; F27B 14/104
  USPC .................. 117/200, 206, 208, 928, 931–932
  See application file for complete search history.

(56) References Cited

U.S. PATENT DOCUMENTS

| 6,136,091 A | * | 10/2000 | Yamazaki | ............... C30B 29/06 117/81 |
| 2009/0151624 A1 | * | 6/2009 | Shimazu | ................. C30B 15/10 117/208 |
| 2010/0107970 A1 | * | 5/2010 | Kodama | ................ C03B 19/095 117/208 |

(Continued)

FOREIGN PATENT DOCUMENTS

| EP | 2071059 A1 | 6/2009 |
| EP | 2182099 A1 | 5/2010 |

(Continued)

OTHER PUBLICATIONS

Extended European Search Report mailed Jul. 19, 2012, issued in corresponding European Application No. EP 11191129.3, filed Nov. 29, 2011, 5 pages.

(Continued)

*Primary Examiner* — Kenneth A Bratland, Jr.
(74) *Attorney, Agent, or Firm* — Law Office of Katsuhiro Arai

(57) ABSTRACT

Provided is a vitreous silica crucible, which is resistant to deformation and corrosion even when heated at high temperature for a long time. There is provided a vitreous silica crucible of the present invention including a substantially cylindrical straight body portion, a curved bottom portion, and a corner portion smoothly connecting the straight body portion and the bottom portion, wherein a wall of the vitreous silica crucible includes, from an inner surface side, a transparent layer and a bubble-containing layer, and a ratio of a thickness of the bubble-containing layer with respect to a thickness of the transparent layer at an intermediate position between an upper end and a lower end of the straight body portion is 0.7 to 1.4.

5 Claims, 14 Drawing Sheets

(56) References Cited

U.S. PATENT DOCUMENTS

| | | | | |
|---|---|---|---|---|
| 2010/0147213 A1* | 6/2010 | Harada | ............... | C03B 19/095 117/208 |
| 2010/0314400 A1* | 12/2010 | Kanda | ................... | C30B 29/06 220/669 |
| 2011/0011334 A1 | 1/2011 | Shimazu | | |

FOREIGN PATENT DOCUMENTS

| | | | | |
|---|---|---|---|---|
| EP | 2251460 A1 | 11/2010 | | |
| JP | 2000-086383 A | 3/2000 | | |
| JP | 2002-154894 A | 5/2002 | | |
| JP | 2002-284596 A | 10/2002 | | |
| JP | 2002-326889 A | 11/2002 | | |
| JP | 2002-326892 A | 11/2002 | | |
| JP | 2003-081689 A | 3/2003 | | |
| JP | 2004-352580 A | 12/2004 | | |
| JP | 2005-330157 A | 12/2005 | | |
| JP | 2006-089301 A | 4/2006 | | |
| JP | WO 2009041684 A1 * | 4/2009 | ............ | C03B 19/095 |
| JP | WO 2009099084 A1 * | 8/2009 | .............. | C30B 15/10 |
| WO | WO 2009041684 A1 * | 4/2009 | | |
| WO | WO 2009099084 A1 * | 8/2009 | | |

OTHER PUBLICATIONS

Notification of Reasons for Refusal, including machine translation, mailed Nov. 12, 2013, issued in corresponding Japanese Patent Application No. 2010-268841, filed Dec. 1, 2010, 7 pages.

\* cited by examiner

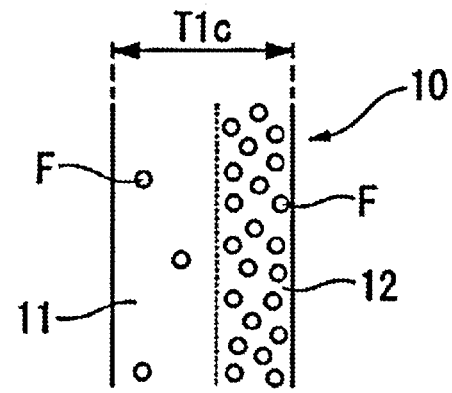
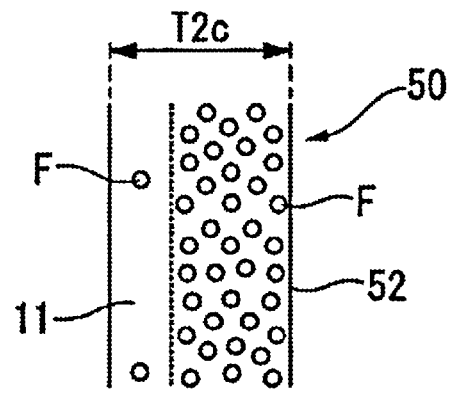
After Heating
After Heating
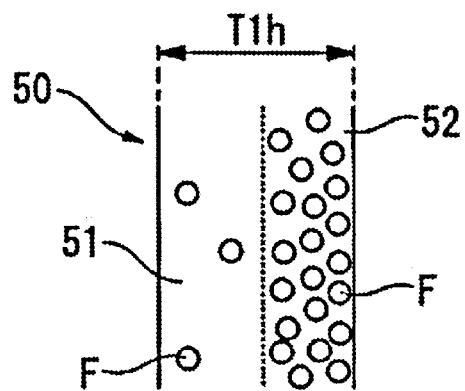
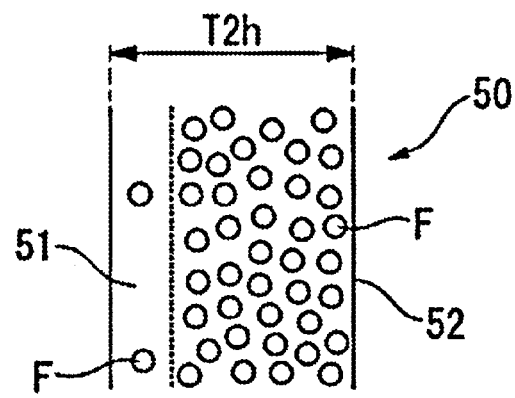
Fig. 2A
Fig. 2B

VITREOUS SILICA CRUCIBLE WITH SPECIFIC RATIO OF TRANSPARENT LAYER AND BUBBLE-CONTAINING LAYER THICKNESSES

CROSS-REFERENCE TO RELATED APPLICATION

This application is related to Japanese Patent Application No. 2010-268841 filed on Dec. 1, 2010, whose priority is claimed and the disclosure of which is incorporated by reference in its entirety.

BACKGROUND OF THE INVENTION

1. Field of the Invention

The present invention relates to a vitreous silica crucible suitable for manufacturing a silicon single crystal, and, more specifically, a vitreous silica crucible that can suppress deformation by heat.

2. Description of the Related Art

A semiconductor silicon single crystal is, in general, manufactured by the Czochralski method (CZ method) in which a single crystal is pulled from silicon melt obtained by heating and melting raw material polycrystalline silicon. A bowl-shaped vitreous silica crucible having an upper opening is used to retain the polycrystalline silicon. The vitreous silica crucible is manufactured by use of natural silica powder or synthetic silica powder as raw material.

Such a vitreous silica crucible, in general, includes plural layers with different properties (See, e.g., JP-A-2004-352580). The layers include a transparent vitreous silica layer containing scarce bubbles (hereinafter, referred to as "transparent layer") on the inner surface, and a vitreous silica layer containing a large amount of bubbles (hereinafter, referred to as "bubble-containing layer") on the outer surface.

The innermost layer contacting silicon melt in severe conditions, which are, for example, at 1400 degrees C. for scores of hours, is comprised of a smooth transparent layer having scarce bubbles. When bubbles exist, the bubbles can promote growth of a micro crystal such as cristobalite during melting silicon or pulling a single crystal, and in addition, when the inner surface of the crucible is corroded in the course of the pulling, the bubbles can expand and cause peeling of the micro crystal, which results in deterioration of the single crystallization yield. Therefore, the innermost layer is comprised of a bubble-free layer. However, in order to prevent melt surface vibration of silicon melt and maintain the crucible strength during pulling of a silicon ingot, the bubble content ratio of the transparent layer is set to be 0.1% or more in an upper portion of the straight body portion, which is a portion corresponding to the melt surface of the silicon melt.

On the other hand, the outermost surface of the vitreous silica crucible is comprised of a bubble-containing layer in order to (1) suppress heat release from silicon melt and enhance the heat keeping effect to improve the uniformity in the heated state and the heat efficiency, (2) dissipate heat from the surrounding of the vitreous silica crucible to prevent localized heating, and (3) maintain the crucible strength during pulling of a single crystal.

Nowadays, in pulling a silicon single crystal, the time to pull a silicon single crystal is increased three or more times compared with a conventional pulling process, to obtain a silicon single crystal having an excellent property. However, when the vitreous silica crucible is heated for a long time, bubbles contained in the vitreous silica crucible expand eminently, which lead to deformation or corrosion of the vitreous silica crucible. This causes problems such as that melt surface vibration excessively occurs and turbulent flow occurs locally. Furthermore, the deformation changes the crucible inner volume. The change of the inner volume leads to the change of the melt surface position of silicon melt. Furthermore, it can prevent single crystallization, which leads to a drop in the single crystallization yield and deterioration in quality.

For example, as shown in FIG. 13, the vitreous silica crucible C for pulling a single crystal includes an inner layer (transparent layer) C1 contacting silicon melt during pulling of a single crystal, and an outer layer (bubble-containing layer) C2. The bubble content ratio of the upper portion C3 of the crucible inner layer C1 is different from that of the lower portion C4.

The upper portion C3 of the crucible inner layer C1 is a region from the rim portion C5 at the upper end to the lowered melt surface position at the beginning stage of pulling of a silicon single crystal. In more detail, the upper portion C3 is a region from the rim portion C5 to the melt surface position lowered until a shoulder of a silicon single crystal is formed.

In pulling of a silicon single crystal by use of the CZ method, melt Y filled in a crucible C is heated by use of a heater H, and a seed crystal K is contacted with melt Y to grow a single crystal I. A shoulder is formed after necking to remove dislocation.

The lowered melt surface position is shown as reference symbol Y0 in FIG. 14, and is a height position at the end of forming the shoulder Is for enlarging a diameter to form a straight body portion to be sliced to produce wafers, and in other words, is a height position at the beginning of the formation of the straight body portion It. In FIG. 14, the state at the end of formation of the shoulder Is and the straight body portion It are shown in a solid line and a dotted line, respectively.

In pulling of a single crystal I, in particular, at the beginning, there is observed a phenomenon that the melt surface of silicon melt periodically vibrates. When the melt surface vibration occurs, there occur problems that a seed crystal cannot be connected to the melt surface and silicon is polycrystallized during pulling. The reason for the melt surface vibration is the generation of SiO gas and so on which is generated by the reaction between silicon melt and vitreous silica, and the reaction is activated by increase of the pulling temperature and decrease of the ambient pressure (See JP-A-2003-081689, JP-A-2002-326892, and JP-A-2002-154894). In particular, the pulling is unstable until a shoulder is formed after growth of a seed crystal connected to silicon melt, and thus can be easily affected by the melt surface vibration.

In order to prevent melt surface vibration caused by expansion of the incorporated bubbles, and deformation and corrosion of a vitreous silica crucible, there is known a crucible having an upper one third portion of the crucible whose OH group content in the inner layer is smaller by 100 ppm or more than that of the upper half of the outer layer and having a lower two third portion of the crucible whose OH group content in the inner layer is larger by 100 ppm or more than that of the lower half of the outer layer (See JP-A-2005-330157).

Furthermore, there is also known a vitreous silica crucible having a transparent layer made of transparent vitreous silica on the inner surface side and a opaque silica layer made of opaque vitreous silica having many closed bubbles on the outer surface side, wherein the red fluorescence intensity of the transparent layer is more than 0.05 and 0.5 or less, and the difference of the average value of the red fluorescence intensity between the bubble-containing layer and the transparent layer is 0.9 or more and the ratio is 3.0 or more (See JP-A-2006-089301).

SUMMARY OF THE INVENTION

However, it is very difficult to selectively change the OH group content only in a specific portion of the vitreous silica crucible as in JP-A-2003-081689, and it is not practical to apply such a crucible to industrial mass production.

Furthermore, JP-A-2002-326892 describes that OH group content is changed to control the red fluorescence intensity in the bubble-containing layer and the transparent layer. However, as mentioned above, it is difficult to change the OH group content only in a specific portion.

The present invention has been made in view of such circumstances, and provides a vitreous silica crucible that is resistant to deformation and corrosion even when heated at high temperature for a long time.

There is provided a vitreous silica crucible of the present invention that comprises a substantially cylindrical straight body portion, a curved bottom portion, and a corner portion smoothly connecting the straight body portion and the bottom portion, wherein a wall of the vitreous silica crucible includes, from an inner surface side, a transparent layer and a bubble-containing layer, and a ratio of a thickness of the bubble-containing layer with respect to a thickness of the transparent layer at an intermediate position between an upper end and a lower end of the straight body portion is 0.7 to 1.4.

The bubble content ratio of the transparent layer is preferably 0.01% or less in the center of the bottom portion, and less than 0.2% at the border between the bottom portion and the corner portion, and 0.1% or less in the upper half of the straight body portion (which is a region from the center to the upper end of the straight body portion). The bubble content rate of the bubble-containing layer is preferably 0.2% or more and 1% or less.

The average diameter of bubbles contained in the transparent layer is preferably less than 100 μm. The average diameter of bubbles contained in the bubble-containing layer is preferably 20 μm or more and 200 μm or less.

The thickness of the transparent layer is preferably 2 mm or more and 5 mm or less at the border between the bottom portion and the corner portion, 9 mm or more and 11 mm or less at the border between the corner portion and the straight body portion, and 4 mm or more and 8 mm or less at the intermediate position between the upper end and the lower end of the straight body portion. The thickness of the bubble-containing layer is preferably 7 mm or more and 8.5 mm or less at the border between the bottom portion and the corner portion, 2 mm or more and 4 mm or less at the border between the corner portion and the straight body portion, and 5 mm or more and 8 mm or less at the intermediate position between the upper end and the lower end of the straight body portion.

The volume expansion rate, after 24-hour heat treatment at 1500 degrees C., at an intermediate position between the upper end and the lower end of the straight body portion of the vitreous silica crucible is preferred to be 3% or less.

Furthermore, the transparent layer may be made of at least one of synthetic vitreous silica and natural vitreous silica, and the bubble-containing layer may be made of natural vitreous silica.

The transparent layer constituting the vitreous silica crucible contains scarce bubbles, and the bubble-containing layer contains more bubbles than the transparent layer. Thus, the thermal expansion rate of the bubble-containing layer is much larger than that of the transparent layer. In the vitreous silica crucible of the present invention, the ratio of the thickness of the bubble-containing layer with respect to the thickness of the transparent layer at an intermediate position between the upper end and the lower end of the straight body portion is 0.7 to 1.4. Therefore, the ratio of the transparent layer with respect to the total wall thickness is larger than a conventional crucible, and thus the thermal expansion of the crucible can be suppressed. Therefore, even when a vitreous silica crucible is heated at a high temperature of, for example, 1500 degrees C. for a long time, the change in the thickness of the vitreous silica crucible can be minimized.

Furthermore, it leads to reduction of deformation and corrosion of the vitreous silica crucible. This further reduces change in the crucible inner volume and the melt surface position, and reduces release of micro crystals (such as cristobalite formed in the crucible inner surface) into silicon melt. Thus, problems such as a drop in the single crystallization yield and deterioration in quality can be prevented.

When the transparent layer is thinner than the aforementioned ratio, various problems as in the conventional crucible are more likely to appear. When the transparent layer is thicker than the aforementioned ratio, the bubble-containing layer is too thin, and thus the heat keeping effect and the uniformity of the heated state of silicon melt can be insufficient.

BRIEF DESCRIPTION OF THE DRAWINGS

FIG. 2 is an explanation drawing showing a change of a vitreous silica crucible by heating.

DESCRIPTION OF THE PREFERRED EMBODIMENTS

Hereinafter, a preferred embodiment of a vitreous silica crucible of the present invention will be explained with reference to the drawings. The embodiment is for the purpose of helping to understand the present invention, and thus does not limit the present invention. Furthermore, drawings used in the descriptions below are for explanation of the present invention, and thus the important part may be enlarged. Therefore, the dimensions, the ratios, and so on of the components are not necessarily to scale.

Figure 1:
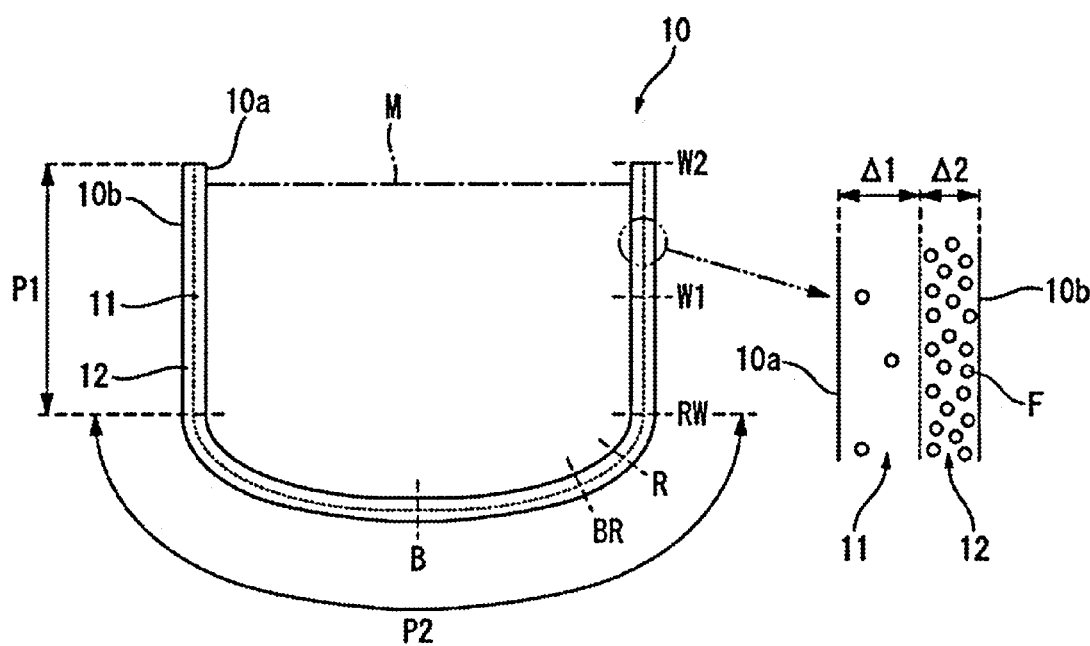
FIG. 1 is a longitudinal sectional view showing one embodiment of a vitreous silica crucible of the present invention.

FIG. 1 is a longitudinal sectional view showing a vitreous silica crucible of the present invention. The vitreous silica crucible 10 has a curved bottom portion, and retains silicon melt M, which contacts the innermost surface 10a during pulling a silicon single crystal.

As shown in FIG. 1, the vitreous silica crucible 10 has a substantially cylindrical straight body portion P1 ranging from the upper end W2 to the lower end RW, and a curved portion P2 ranging from the lower end RW to the bottom center position B. These portions are integrally formed. The curved portion P2 includes a bottom portion, from B to BR in FIG. 1, having a constant curvature, and a corner portion from BR to RW in FIG. 1. The corner portion is in the border between the substantially cylindrical wall portion P1 and the bottom portion to smoothly connect the wall portion P1 and the bottom portion. In other words, when the radius of curvature along the crucible inner surface is measured from the center of the bottom portion toward the upper end of the opening, the radius of curvature is constant at the bottom center B, and starts to change at BR, and becomes equal to that of the wall portion P1 (which is infinite when straight body portion is cylindrical) at RW. The portion from BR to RW is the corner portion.

The vitreous silica crucible 10 includes, from the inner surface side, the transparent layer 11 and the bubble-containing layer 12. The transparent layer 11 is preferred to be the innermost layer. The bubble-containing layer 12 may be the outermost layer, or another layer may be provided on the outer side of the bubble-containing layer 12.

When the innermost layer 10a contacting silicon melt is made of the smooth transparent layer 11 containing scarce bubbles, drop in the single crystallization yield can be prevented because expansion of internal bubbles during melting silicon and pulling a single crystal can be prevented, and thus partial peel of the crucible inner surface can be prevented.

Furthermore, when the outermost layer 10b of the vitreous silica crucible 10 is made of the bubble-containing layer 12, heat release from silicon melt M can be prevented, and thus the heat keeping effect is enhanced. Furthermore, dissipation of heat from the surrounding of the vitreous silica crucible 10 is promoted, and thus topical temperature increase is prevented.

The bubble content rate of the transparent layer 11 is, for example, 0.01% or less at the center of the bottom portion (B in FIG. 1), less than 0.2% at the border between the bottom portion and the corner portion (BR in FIG. 1), 0.1% or less in the upper half of the straight body portion P1, which is a region from the center (W1 in FIG. 1) to the upper end (W2 in FIG. 1) of the straight body portion P1. The average diameter of bubbles included in the transparent layer 11 is less than 100 μm.

On the other hand, the bubble content rate of the bubble-containing layer 12 is, for example, 0.2% or more and 1% or less. The average diameter of bubbles contained in the bubble-containing layer 12 is, for example, 20 μm or more and 200 μm or less.

The ratio of the thickness Δ2 of the bubble-containing layer 12 with respect to the thickness Δ1 of the transparent layer 11 at the intermediate position W1 is 0.7 to 1.4. When the ratio is smaller than 0.7, the bubble-containing layer is too thin, and the heat keeping effect and the uniformity of the heated state of silicon melt can be insufficient. When the ratio is more than 1.4, the transparent layer 11 is too thin, and various problems as in the conventional crucible are more likely to appear.

Furthermore, the thickness of the transparent layer 11 is preferred to be larger than that of the bubble-containing layer 12 at the corner portion (which is from BR to RW in FIG. 1). The ratio of Δ1:Δ2 can be 2.25:1 to 10:1 in this portion.

The thicknesses of the transparent layer 11 and the bubble-containing layer 12 are not in particular limited. A crucible having an opening diameter of 24 inches was manufactured, and the following findings have been obtained as to the preferred thicknesses of the transparent layer 11 and the bubble-containing layer 12.

It is preferred that the thickness of the transparent layer 11 is 4 mm or more and 8 mm or less and the thickness of the bubble-containing layer 12 is 5 mm or more and 8 mm or less in the intermediate position (W1 in FIG. 1) between the upper end and the lower end of the straight body portion. When the thicknesses are in such range, both thicknesses are appropriate, and thus the effect of the invention is exhibited effectively.

It is preferred that the thickness of the transparent layer 11 is 9 mm or more and 11 mm or less, and the thickness of the bubble-containing layer 12 is 2 mm or more and 4 mm or less at the border (RW in FIG. 1) between the corner portion and the straight body portion. When a crucible is manufactured by the rotating mold method, the transparent layer tends to be thick at the border between the corner portion and the straight body portion, and thus the aforementioned crucible has an advantage that it is easy to manufacture.

It is preferred that the thickness of the transparent layer 11 is 2 mm or more and 5 mm or less, and the thickness of the bubble-containing layer 12 is 7 mm or more and 8.5 mm or less at the border (BR in FIG. 1) between the bottom portion and the corner portion. When a crucible is manufactured by the rotating mold method, the bubble-containing layer tends to be thick at the border between the bottom portion and the corner portion, and thus the aforementioned crucible has an advantage that it is easy to manufacture.

The thicknesses of the respective layers change smoothly in the region between the portions mentioned above.

In the vitreous silica crucible 10 having the aforementioned configuration, the volume expansion rate after heating at 1500 degrees C. for 24 hours in W1 can be 3% or less.

FIG. 2 is a sectional view showing the thickness change, by heat, of a conventional vitreous silica crucible. In the vitreous silica crucible 10 of the present invention shown in FIG. 2(a), when the crucible is heated from room temperature (before heating) to 1500 degrees C., bubbles F contained in the transparent layer 11 and the bubble-containing layer 12 expand so that the thickness T1c before the heating increases to the thickness T1h after the heating.

The transparent layer 11 contains scarce bubbles, and the bubble-containing layer 12 contains more bubbles F than the transparent layer 11. Therefore, the thermal expansion rate of the bubble-containing layer 12 is much larger than that of the transparent layer 11. The thickness of the transparent layer 11 of the vitreous silica crucible 10 of the present invention is larger than that of a conventional vitreous silica crucible, and thus even when the vitreous silica crucible 10 is heated at a high temperature of 1500 degrees C. for a long time, the difference of the thickness T1c before the heating and the thickness T1h after the heating can be minimized.

Thus, it leads to reduction of deformation and corrosion of the vitreous silica crucible. This further reduces change in the crucible inner volume and the melt surface position, and reduces release of micro crystals such as cristobalite formed in the crucible inner surface into silicon melt. This prevents problems such as excessive melt surface vibration of silicon melt in the vitreous silica crucible, local turbulent flow, and drop in the single crystallization yield.

On the other hand, as shown in FIG. 2(b), the conventional vitreous silica crucible 50 contains a large amount of bubbles F, and the thickness of the bubble-containing layer 52 having a large thermal expansion rate is larger than that of the transparent layer 51. Therefore, when the crucible is heated at a high temperature of 1500 degrees C. for a long time, the difference between the thickness T2c before the heating and the thickness T2h after the heating becomes larger. In other words, the thermal volume expansion rate is large. Therefore, there occur various problems such as melt surface vibration of silicon melt in the vitreous silica crucible 50 occur, turbulent flow occurs locally, and single crystallization yield decreases by high temperature heating for a long time.

The transparent layer 11 constituting the vitreous silica crucible 10 may be made of synthetic vitreous silica and/or natural vitreous silica. Synthetic vitreous silica contains extremely scarce impurities, and thus when the transparent layer 11 constituting the innermost layer 10a of the vitreous silica crucible 10 is made of synthetic vitreous silica, mixing of impurities into silicon melt can be prevented.

Here, synthetic vitreous silica is made of synthetic silica (e.g., synthetic silica powder), and synthetic silica is a chemically synthesized or manufactured material, and amorphous. Because raw material of synthetic silica is gas or liquid, it can be easily purified, and thus synthetic silica powder can be more highly-pure than natural silica powder. Raw material of synthetic vitreous silica may be gaseous raw material such as silicon tetrachloride, or may be liquid raw material such as silicon alkoxide. In synthetic vitreous silica, the amount of total impurities can be made 0.1 ppm or less.

Synthetic vitreous silica made by the sol-gel method usually includes 50 to 100 ppm of residual silanol generated by hydrolysis of alkoxide. Synthetic vitreous silica made by silicon tetrachloride as raw material can control the amount of silanol in a broad range of 0 to 1000 ppm, and usually includes chlorine in a concentration of approximately 100 ppm or more. When alkoxide is used as raw material, synthetic vitreous silica not including chlorine can be easily obtained.

Synthetic silica powder made by the sol-gel method includes silanol in a concentration of 50 to 100 ppm before fusing as mentioned above. When the powder is vacuum-fused, silanol is removed and the amount of silanol in the obtained vitreous silica is reduced to approximately 5 to 30 ppm. It should be noted that the amount of silanol changes depending on fusing conditions such as fusing temperature, elevated temperature, etc. Natural vitreous silica obtained by fusing natural silica powder in the same conditions includes silanol in a concentration of less than 50 ppm.

In general, synthetic vitreous silica is said to have lower high-temperature viscosity than natural vitreous silica. One of the reasons for the lower high-temperature viscosity is that silanol or halogen destroys a network structure of $SiO_4$ tetrahedron.

Synthetic vitreous silica has high light transmissibility for ultraviolet with a wavelength of approximately 200 nm or less. This synthetic vitreous silica has similar properties to synthetic vitreous silica made of silicon tetrachloride as raw material and used for ultraviolet optics.

Unlike natural vitreous silica, when synthetic vitreous silica is excited by ultraviolet light with a wavelength of 245 nm, fluorescence peaks are not observed in the obtained fluorescence spectrum.

On the other hand, natural vitreous silica contains a large amount of inclusions, and thus when the bubble-containing layer 12 constituting the outermost layer 10b of the vitreous silica crucible 10 is made of natural vitreous silica, the mechanical strength of the entire vitreous silica crucible 10 can be enhanced.

Furthermore, natural vitreous silica is made of natural silica (e.g., natural silica powder). Natural silica means a material obtained by the processes of digging out naturally-existing quartz raw stones followed by crushing and purification, etc. Natural silica powder is made of α-quartz crystal. Natural silica powder contains Al and Ti in a concentration of 1 ppm or more. Natural silica powder contains other metal impurities in a higher concentration than synthetic silica powder. Natural silica powder barely contains silanol.

When light transmissibility of natural vitreous silica is measured, light transmissibility rapidly decrease as the wavelength becomes shorter than 250 nm and light transmissibility is very small for light with a wavelength of 200 nm. This is mainly because of Ti contained in a concentration of about 1 ppm as impurities. An absorption peak is observed at around 245 nm. This peak is assigned to oxygen deficiency defects.

When natural vitreous silica is excited by ultraviolet light with a wavelength of 245 nm, fluorescence peaks at wavelengths of 280 nm and 390 nm are observed. These peaks are assigned to oxygen deficiency defects in the vitreous silica.

Whether vitreous silica is natural or synthetic may be determined by measuring either impurities concentrations, the amount of silanol, light transmissibility, or a fluorescence spectrum obtained by exciting the vitreous silica with ultraviolet light with a wavelength of 245 nm.

Figure 3:
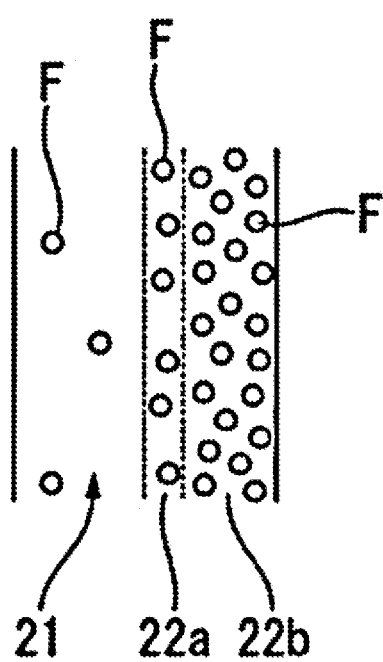
FIG. 3 is an enlarged sectional view showing another embodiment of a vitreous silica crucible of the present invention.

The structure of the vitreous silica crucible 10 of the present invention is not limited to double layer structure having the transparent layer 11 and the bubble-containing layer 12 as in the aforementioned embodiment. For example, as shown in FIG. 3, the vitreous silica crucible 10 may have a transparent layer 21 and two or more bubble-containing layers 22a, 22b having different bubble content rate from each other. In other words, the bubble content rate (or specific gravity) of the layers changes stepwise. Furthermore, a fine powder layer made of fine powder of vitreous silica may be provided on the outer side of the bubble-containing layer.

Next, a method of manufacturing such a vitreous silica crucible will be explained.

Figure 4:
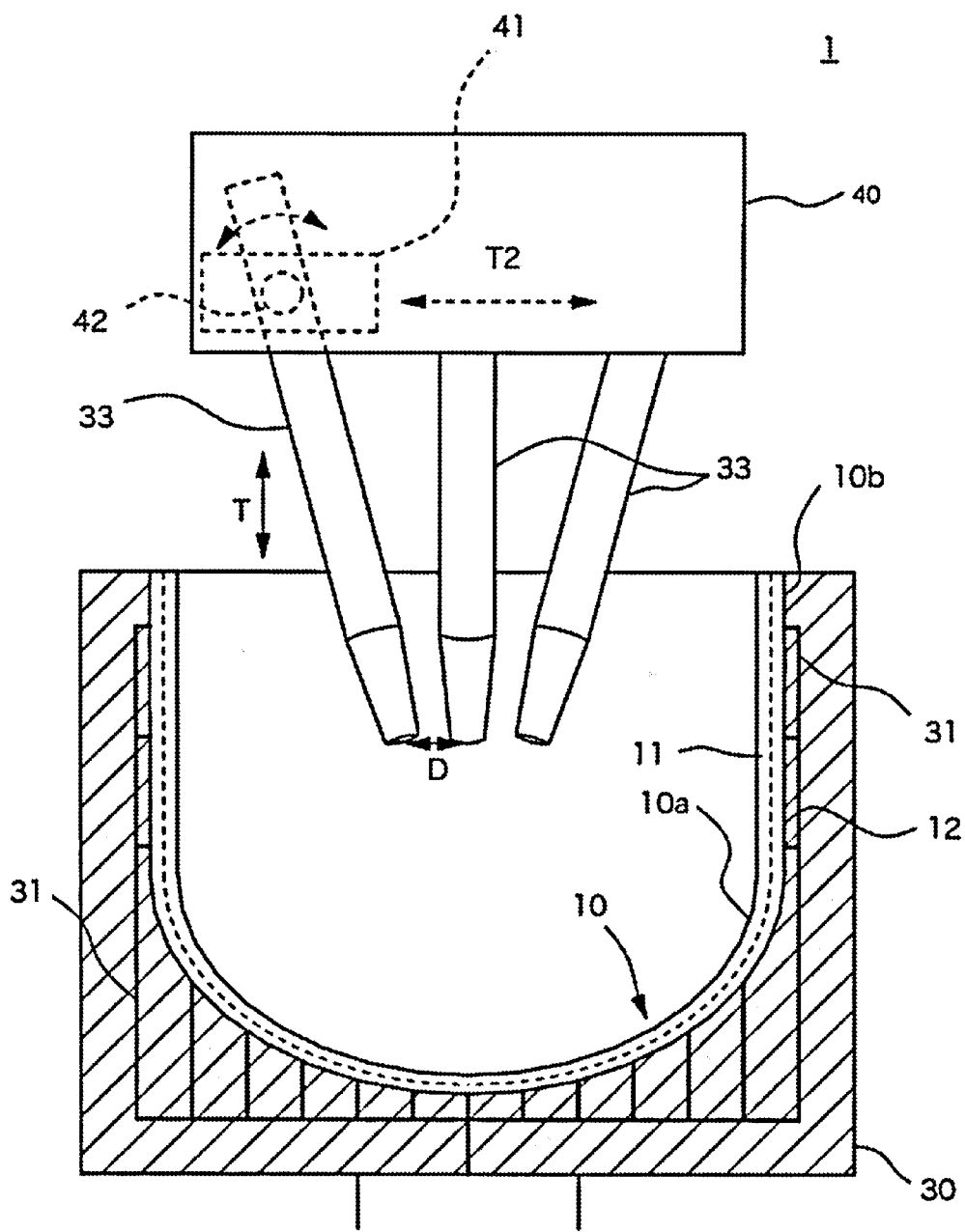
FIG. 4 is an explanation drawing showing a configuration for manufacturing a vitreous silica crucible of the present invention.

As shown in FIG. 4, a vitreous silica crucible manufacturing apparatus of the present embodiment includes a rotating mold 30 defining the outer shape of the vitreous silica crucible and rotatable by a rotation unit (not shown). Silica powder is deposited on the inner surface of the mold 30 in a uniform thickness to form a silica powder layer. Ventilation holes 31 are provided in the mold 30. The ventilation holes 31 are open to the inner surface of the mold 30, and are connected to a depressurizing unit (not shown) to depressurize the inside of the silica powder layer.

Carbon electrodes 33 are provided above the mold 30, and are connected to a power-supply unit. The carbon electrodes 33 are used for arc heating. The carbon electrodes 33 are comprised of electrode rods having the same shape so that arc discharge is generated by alternate current three-phase (R phase, S phase, T phase). The carbon electrodes are movable in the vertical direction as shown by the arrow T and the distances between the carbon electrodes are adjustable as shown by the arrow D by use of an electrode position setting unit 40.

As shown in FIG. 4, the electrode position setting unit 40 includes supporting units 41 for supporting the carbon electrodes in a way that the distances between the carbon electrodes are adjustable, a horizontal movement unit for horizontally moving the supporting units 41, and a vertical movement unit for vertically moving the supporting units 41 and the horizontal movement unit together. In the supporting unit 41, the carbon electrode 33 is pivotably supported at an angle setting axis 42, and there is provided a rotation unit for adjusting the rotation angle around the angle setting axis 42.

The distances D between the carbon electrodes 33 can be adjusted by adjusting the angles of the carbon electrodes 33 by the rotation unit and adjusting the horizontal positions of the supporting units 41 by the horizontal movement unit as shown by the arrows in FIG. 4. Furthermore, the vertical position of the tips of the carbon electrodes 33 with respect to the bottom position of the silica powder layer can be adjusted by adjusting the height positions of the supporting units 41 by the vertical movement unit.

In FIG. 4, the supporting unit 41 and so on is shown only for the carbon electrode 33 in the left end, but other electrodes are supported in the same way, and the heights of the respective electrodes can be individually adjusted. When a vitreous silica crucible is manufactured, a raw material such as synthetic silica powder or natural silica powder is deposited on the rotating mold 30 to form a silica powder layer.

In this state, the silica powder layer is arc fused by supplying power to the carbon electrodes (not shown) provided near the center of the mold 30. During the arc fusing, the inner surface side of the mold 30 is depressurized via the ventilation holes 31 formed in the mold 30 to remove bubbles from (deaerate) the inside of the fused silica powder layer. The bubble content rate of the vitreous silica crucible 10 can be adjusted by adjusting the supplied power or the positions of the electrodes 33.

By the aforementioned deaeration control and the heating state control, the transparent layer 11 having scarce bubbles is formed on the inner surface side of the vitreous silica crucible 10, and the bubble-containing layer 12 having plenty of residual bubbles is formed on the outer surface side.

A transparent layer can be formed by subjecting the silica powder layer to a reduced pressure of −50 kPa or more and less than −95 kPa while fusing the silica powder layer. Furthermore, after the transparent layer is formed, a bubble-containing layer can be formed on the outer side of the transparent layer by subjecting the silica powder layer to a pressure of +10 kPa or more and less than −20 kPa. In the present specification, the value of the pressure is the value with reference to the ambient air pressure.

In the vitreous silica crucible 10 of the present invention, the ratio of the thicknesses of the transparent layer 11 and the bubble-containing layer 12 is adjusted to be 1:0.7 to 1:1.4 by elongating the deaeration time.

For example, the deaeration time during the fusing was approximately 150 seconds for a conventional crucible, but the aeration time is approximately 300 seconds in manufacturing the vitreous silica crucible 10 of the present invention. In this case, the thickness of the transparent layer 11 can be made thicker than the conventional crucible.

After the completion of the fusing, a rim cutting process and an inner surface washing process and so on are carried out to complete the manufacturing of the vitreous silica crucible.

Example 1

Figure 5:
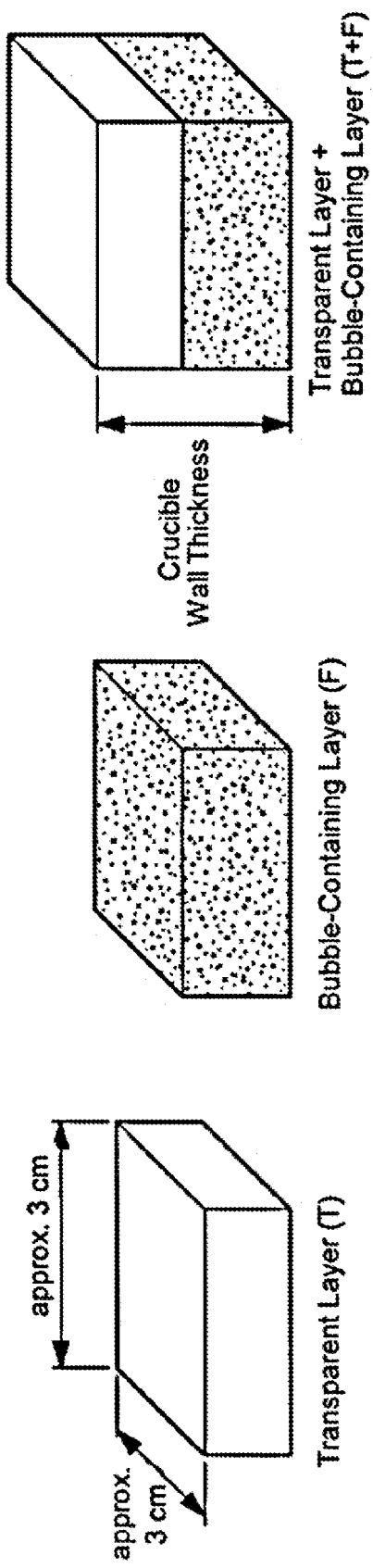
FIG. 5 is an explanation drawing showing an example of a sample used for experiments of the present invention.

Examples according to the present invention are shown below. First, samples having the shape shown in FIG. 5 were cut out from an actual vitreous silica crucible. These samples were taken out from the portions W2, W1, RW, R, BR, and B shown in FIGS. 1. W2 and W1 are the upper end and the center of the cylindrical straight body portion, respectively. RW is the upper end of the corner portion. R is the center of the corner portion. BR is the border between the corner portion and the bottom portion. B is the center of the bottom portion. In figures showing the result, the sample of the transparent layer was shown as T, the sample of the bubble-containing layer was shown as F, and the two-layer sample of the transparent layer and bubble-containing layer was shown as T+F. For these samples, the volume expansion rate, the specific gravity decreased amount, [and?] the bubble content rate were evaluated.

First, the volume expansion rate for the samples T, F, and T+F taken at W2, R, and B were evaluated. In the graph shown in FIG. 6, the volume expansion rate for the samples was measured when they are kept at 1500 to 1600 degrees C. Furthermore, in the graph shown in FIG. 7, the volume expansion rate for the samples was measured when the heating time was 10 hours and 24 hours.

Figure 6:
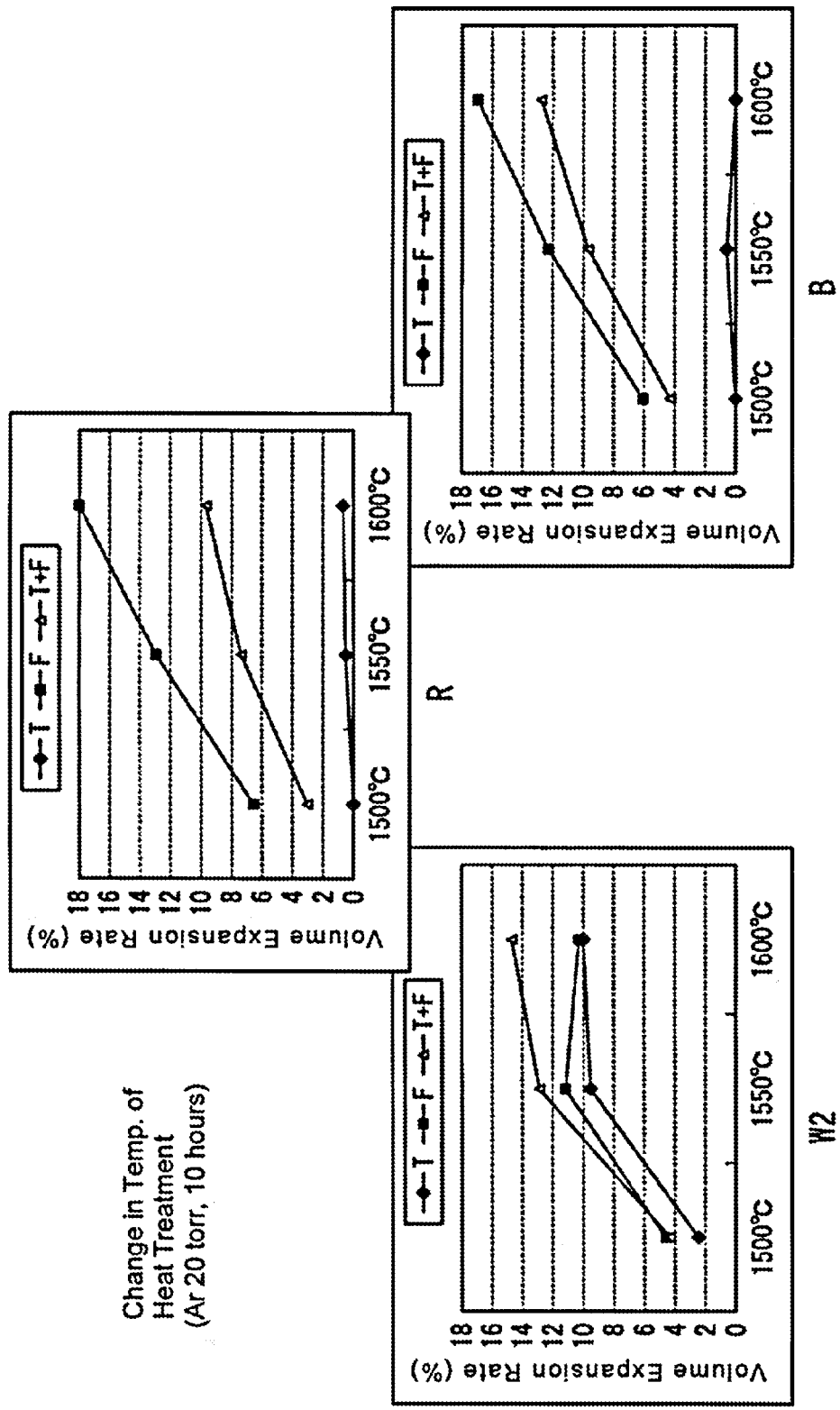
FIGS. 6 to 12 are graphs showing the experimental result of the present invention.
Figure 7:
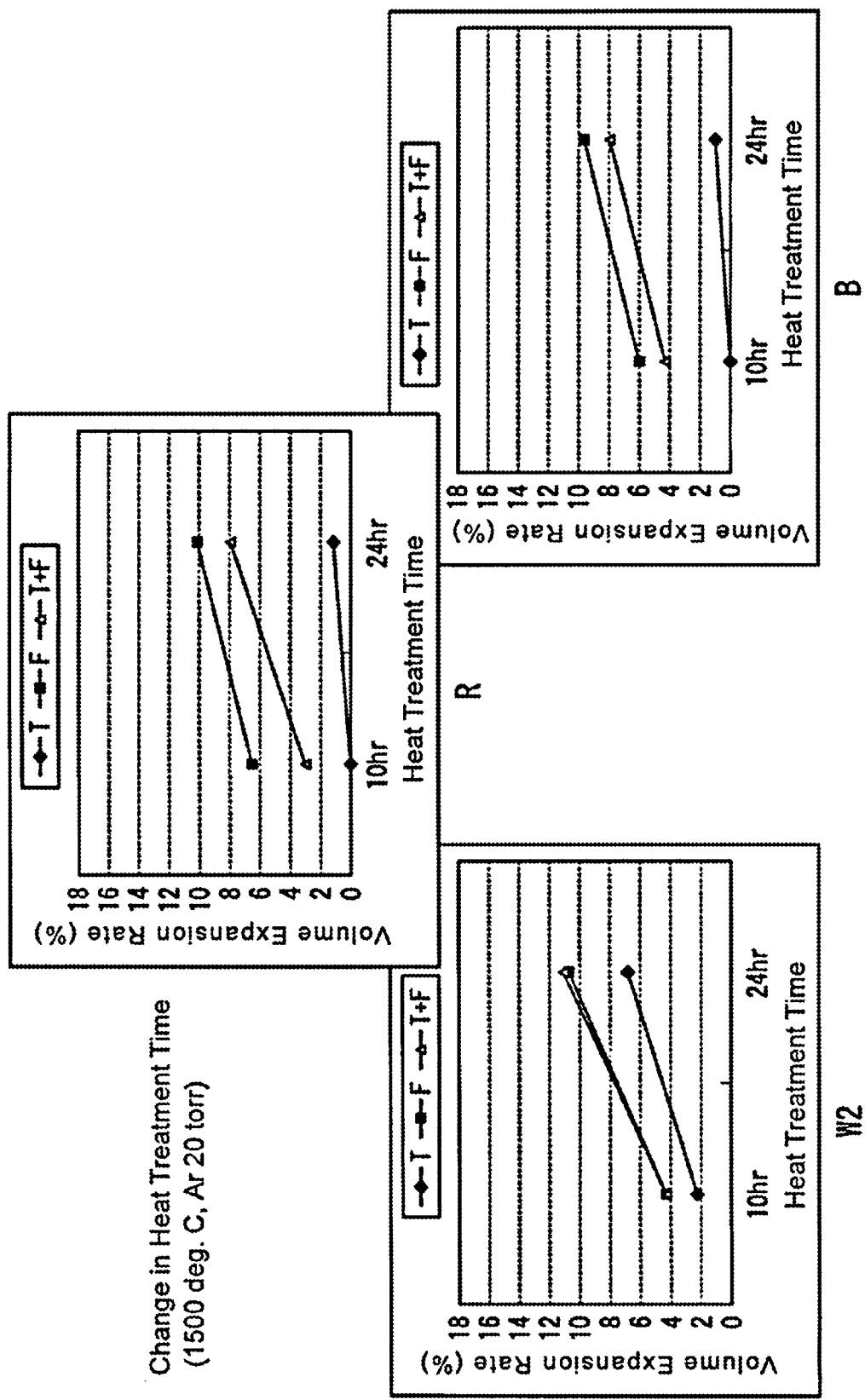

According to the graph shown in FIG. 6, the transparent layer hardly expanded and the bubble-containing layer largely expanded at B and R. According to the graph shown in FIG. 7, the volume expansion rate of the transparent layer was smaller than that of the bubble-containing layer. In W2, the transparent layer expanded largely. This is because more bubbles are incorporated in W2 (a portion, which will be a melt surface position of silicon melt) than the other portions in order to avoid melt surface vibration.

Next, the reduction amount of the specific gravity of the samples T, F, T+F in the portions W2, R, B was measured. In the graph shown in FIG. 8, the reduction amount of the specific gravity was measured by the Archimedes method.

Figure 8:
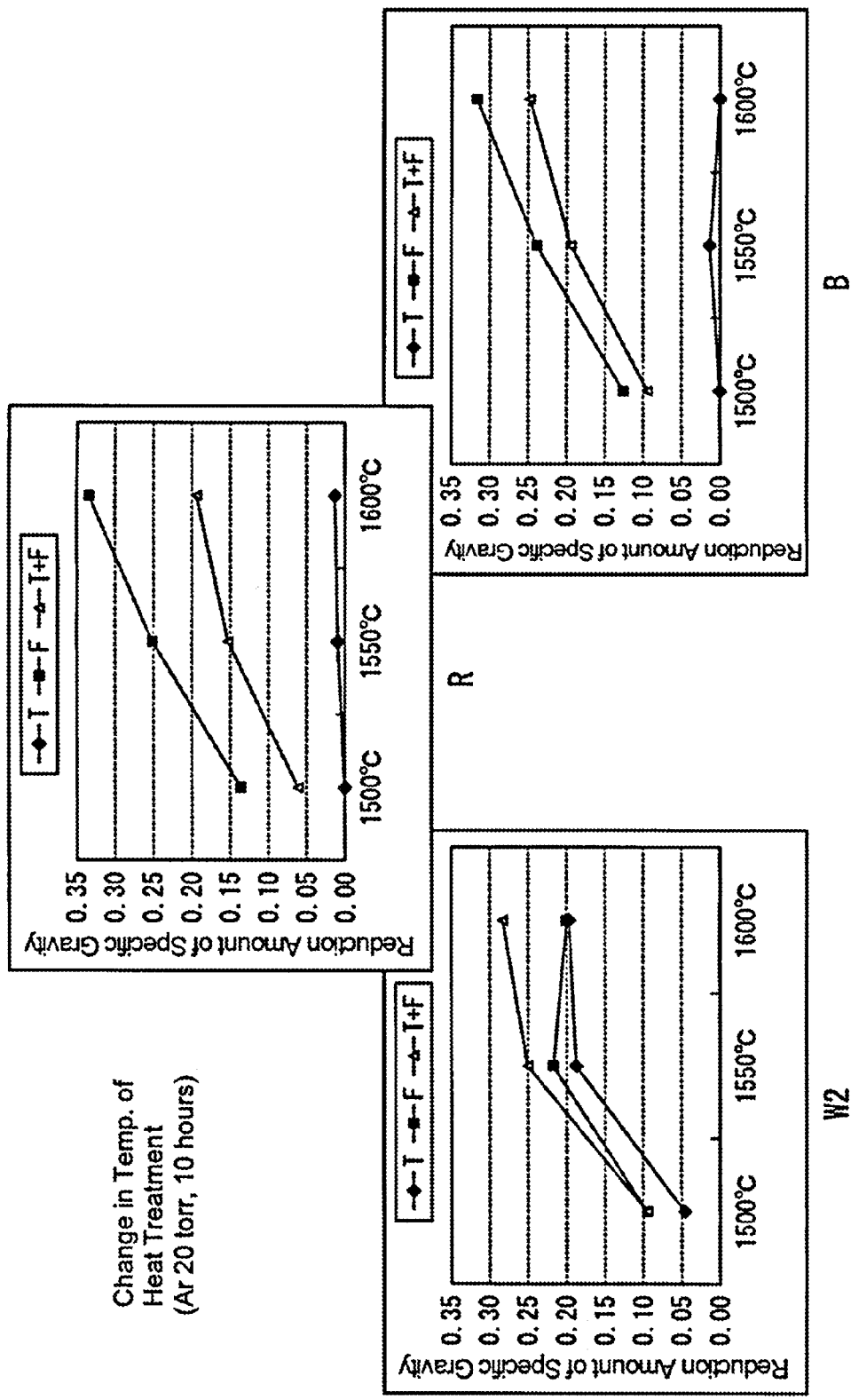

According to FIG. 8, in the portions B and R, the specific gravity of the transparent layer was hardly changed, and the specific gravity of the bubble-containing layer was largely changed.

Next, in the portions W2, R, B, the bubble content rate of the samples T, F, T+F was calculated in accordance with the following formula. The result is shown in the graph shown in FIG. 9.

$$\text{Bubble content rate} = \{(\text{absolute specific gravity} - \text{measurement value})/\text{absolute specific gravity}\} \times 1001,$$
$$\text{wherein the absolute specific gravity} = 2.20$$

Figure 9:
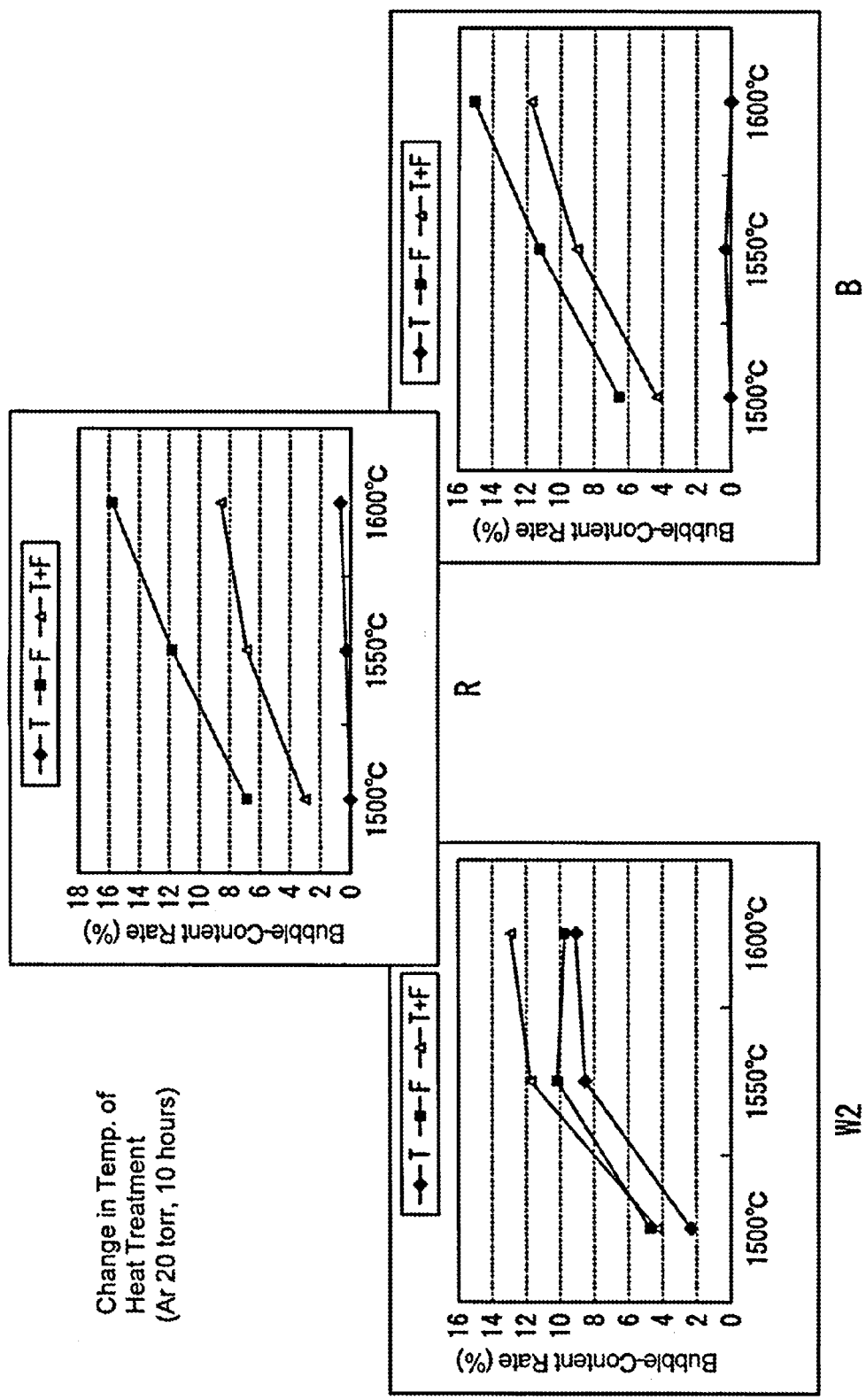

According to the graph shown in FIG. 9, in the portions B and R, the bubble content rate was hardly changed, and the bubble content rate of the bubble-containing layer was largely changed.

Based on the aforementioned result, there was investigated the difference, between the vitreous silica crucible of the present invention in which the transparent layer is relatively thick and the vitreous silica crucible of the conventional comparative example in which the transparent layer is relatively thin, as to the volume expansion rate in the portions W2, R, and B. The measurement result of the volume expansion rate is shown in FIG. 10.

Figure 10:
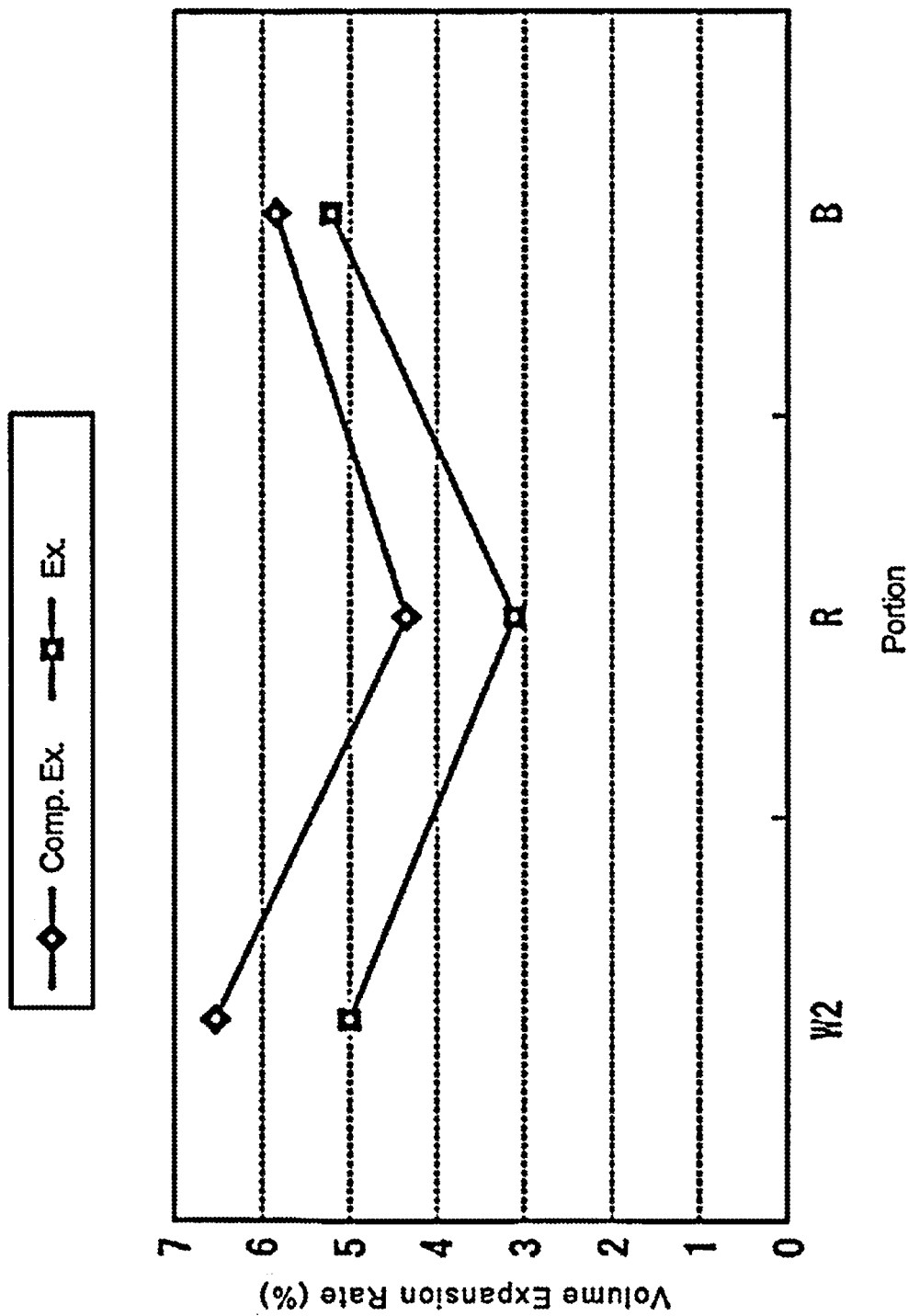

According to FIG. 10, it was observed that the volume expansion rate of the crucible of the present invention is smaller than that of the conventional vitreous silica crucible in any portion of W2, R, and B. In the graph shown in FIG. 10, the sample was kept at 1500 degrees C. for 10 hours to measure the volume expansion rate. Thus, it was observed that the deformation of the vitreous silica crucible of the present invention can be suppressed.

Furthermore, based on the ratio of the thicknesses of the transparent layer and the bubble-containing layer, the expected value and the actual measurement value of the volume expansion rate were compared in the portions W2, W1, RW, R, BR, and B. The result is shown in FIG. 11.

Figure 11:
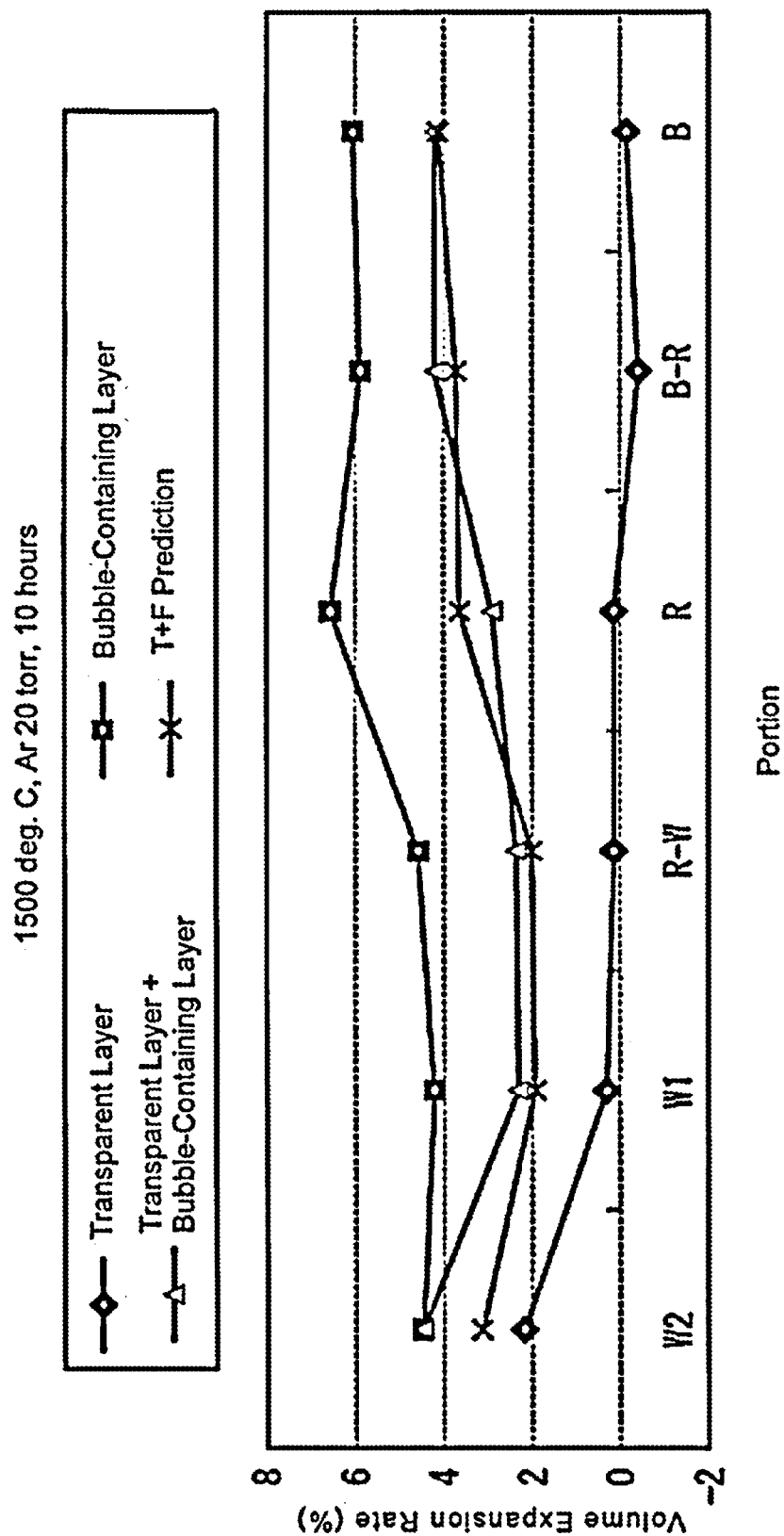

According to the graph shown in FIG. 11, it was found out that it is possible to predict, based on the ratio of the thicknesses of the transparent layer and the bubble-containing layer, the volume expansion rate in various portions of the vitreous silica crucible having these two layers. This result can be used to determine the ratio of the thicknesses of the transparent layer and the bubble-containing layer in order to manufacture a vitreous silica crucible having the volume expansion rate within a target range.

Example 2

A vitreous silica crucible A of the present invention and a conventional vitreous silica crucible B each having an opening diameter of 24 inch (61 cm) were prepared. The thicknesses of the transparent layer and the bubble-containing layer were as shown in Table 1. The bubble content rate of the transparent layer was about 0.005% at the bottom portion, about 0.1% at the border between the bottom portion and the corner portion, and about 0.05% in the upper half of the straight body portion. The average diameter of the bubbles of the transparent layer was about 80 μm. The bubble content rate of the bubble-containing layer was about 0.5%, and the average diameter of the bubbles was about 150 μm.

TABLE 1

|  |  | Transparent Layer (mm) | Bubble-Containing Layer (mm) | Transparent Layer: Bubble-Containing Layer |
|---|---|---|---|---|
| Ex. | Vitreous Silica Crucible A | 6 | 6 | 1:1 |
| Comp. Ex. | Vitreous Silica Crucible B | 4 | 8 | 1:2 |

Figure 12:
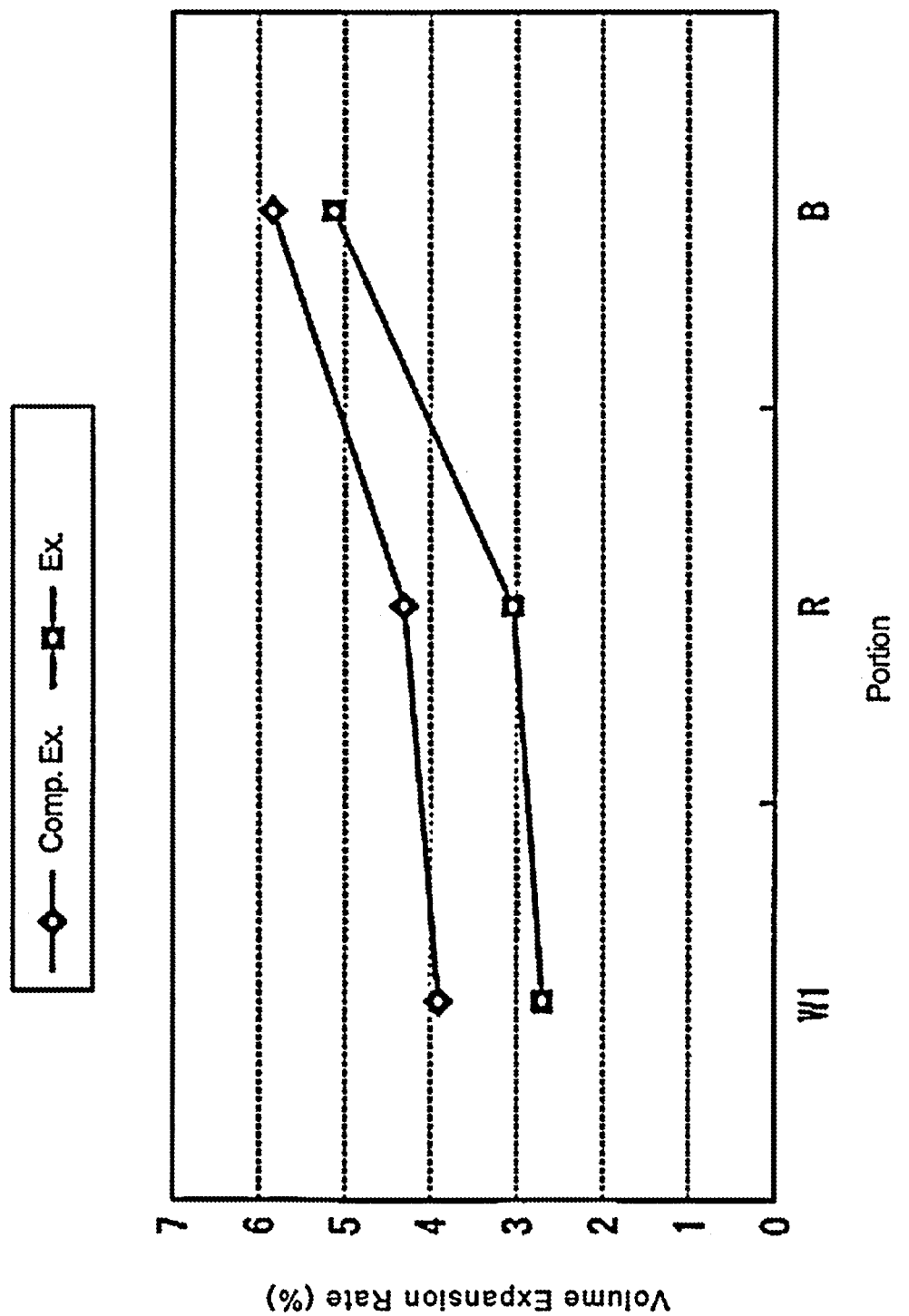
Figure 13:
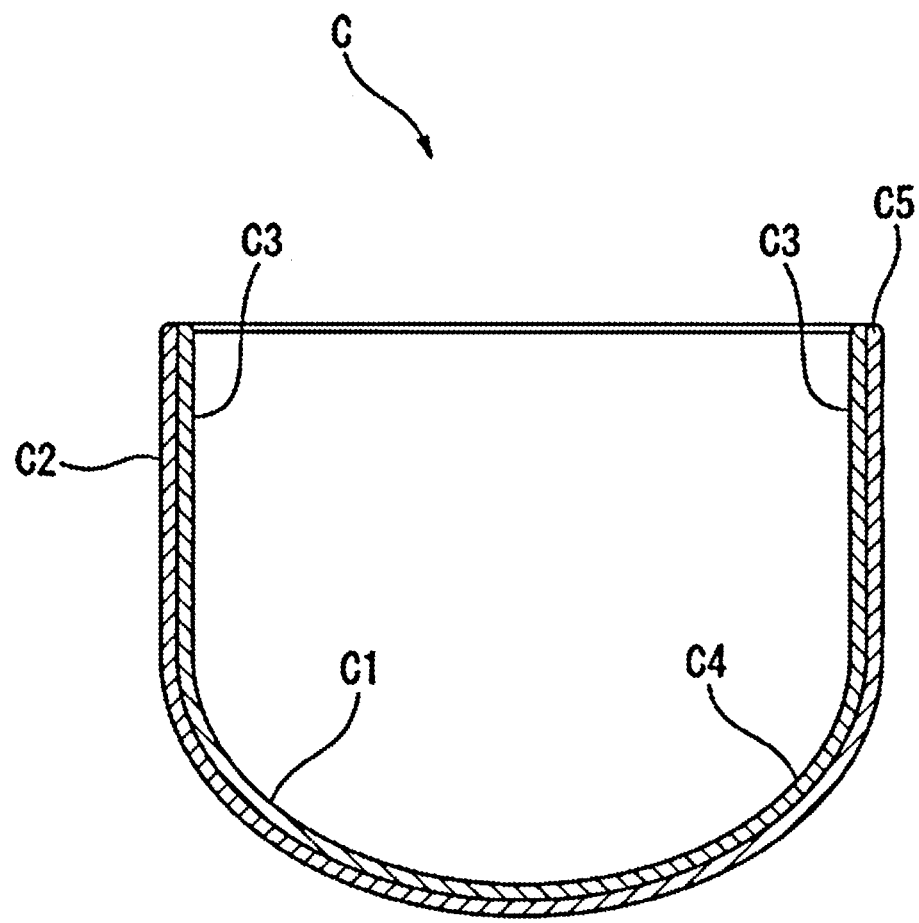
FIG. 13 is a longitudinal sectional view showing a vitreous silica crucible for pulling a single crystal.
Figure 14:
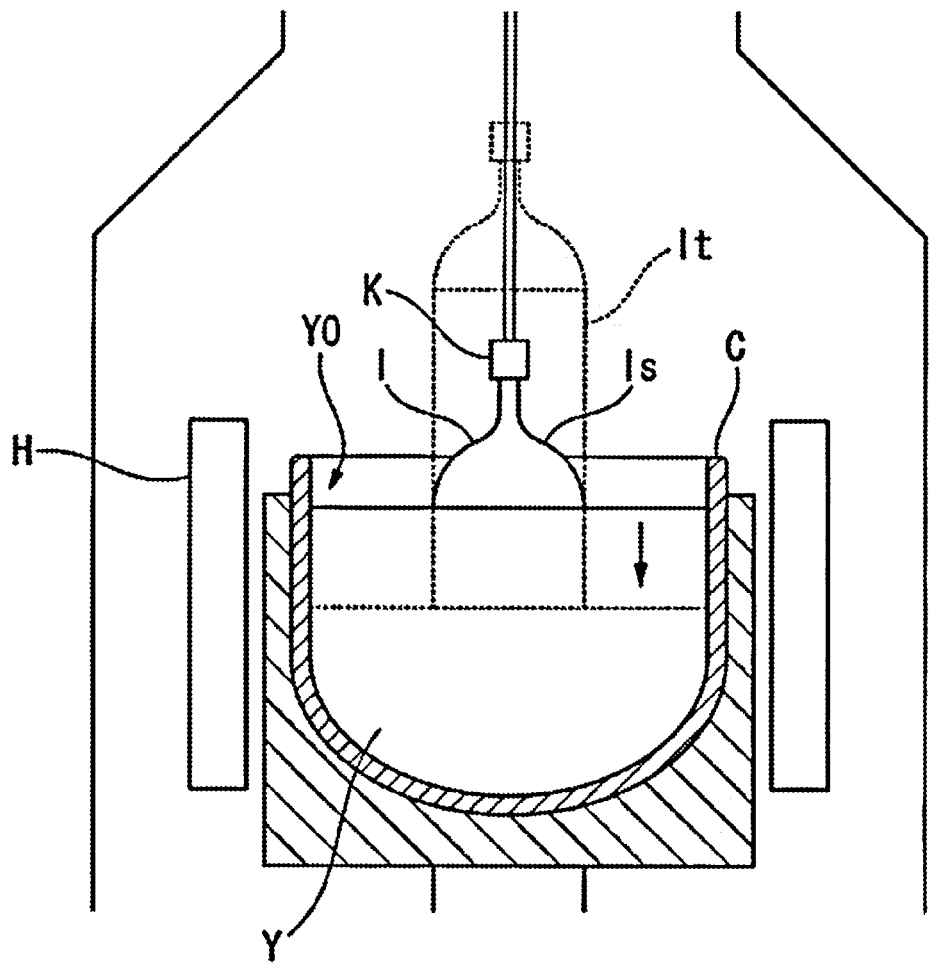
FIG. 14 is a longitudinal sectional view for explaining pulling of a single crystal.

Then, the vitreous silica crucible A and the vitreous silica crucible B were subjected to heat treatment at 1500 degrees C. for 24 hours, and the volume expansion rate was measured at W1, R, and B (See FIG. 1). The measurement result is shown in FIG. 12. According to the result shown in FIG. 12, it was observed that the volume expansion rate of the vitreous silica crucible A of the present invention was lower in all of W1, R, and B than that of the conventional vitreous silica crucible B.

Example 3

Vitreous silica crucibles 1 to 5 were manufactured. Each of the vitreous silica crucibles 1 to 5 has a transparent layer and a bubble-containing layer, each having a thickness shown in Table 2. The vitreous silica crucibles 3 and 5 correspond to vitreous silica crucibles A and B in Example 2. The bubble content rate of the transparent layer and the bubble-containing layer are the same as Example 2. A silicon single crystal was pulled by use of the vitreous silica crucible, and the crystallinity of the obtained single crystal was evaluated. Evaluation of the crystallinity was performed based on the single crystallization yield. The single crystallization yield was a value of (mass of the straight body section of the silicon single crystal)/(mass of silicon melt charged in the crucible right before pulling). The results are shown in Table 2. The evaluation criteria in Table 2 are as follows:

A: single crystallization yield is 0.80 or more and less than 0.99

B: single crystallization yield is 0.70 or more and less than 0.80

C: single crystallization yield is 0.60 or more and less than 0.70

D: single crystallization yield is less than 0.60

TABLE 2

|  |  | Transparent Layer (mm) | Bubble-Containing Layer (mm) | Transparent Layer: Bubble-Containing Layer | Single Crystal-lization Yield |
|---|---|---|---|---|---|
| Comp. Ex. | Crucible 1 | 8 | 4 | 1:0.5 | B |
| Ex. | Crucible 2 | 7 | 5 | 1:0.7 | A |
| Ex. | Crucible 3 (Crucible A) | 6 | 6 | 1:1 | A |
| Ex. | Crucible 4 | 5 | 7 | 1:1.4 | A |
| Comp. Ex. | Crucible 5 (Crucible B) | 4 | 8 | 1:2 | D |

As apparent from Table 2, the single crystallization yield was high in vitreous silica crucibles 2 to 4, whose ratio of the thicknesses of the transparent layer and the bubble-containing layer is 1:07 to 1:1.4. In contrast, the transparent layer of the vitreous silica crucible 1 was too thick, and thus the thickness of the bubble-containing layer was reduced. As a result, the heat keeping effect and the uniformity of the heated state of the silicon melt were insufficient, which led to decrease in single crystallization yield. Furthermore, the bubble-containing layer of the vitreous silica crucible 5 was too thick, and thus the wall largely expanded when the crucible was subjected to high temperature. As a result, there occurred problems such as dropping of cristobalite, which led to decrease in single crystallization yield.

EXPLANATION OF REFERENCE SYMBOL

10 Vitreous Silica Crucible
10a Innermost Surface
10b Outermost Surface
11 Transparent Layer
12 Bubble-Containing Layer
P1 Straight Body Portion
P2 Corner Portion
W1 Middle Portion

What is claimed is:

1. A vitreous silica crucible comprising a substantially cylindrical straight body portion, a curved bottom portion, and a corner portion smoothly connecting the straight body portion and the bottom portion, wherein a wall of the vitreous silica crucible includes, from an inner surface side, a transparent layer and a bubble-containing layer, and a ratio of a thickness of the bubble-containing layer with respect to a thickness of the transparent layer at an intermediate position between an upper end and a lower end of the straight body portion is 0.7 to 1.4;
   wherein the transparent layer is made of at least one of synthetic vitreous silica and natural vitreous silica, and the bubble-containing layer is made of natural vitreous silica;
   wherein a ratio of a thickness of the transparent layer to a thickness of the bubble-containing layer at the corner portion is from 2.25 to 10;
   wherein the thickness of the transparent layer is larger than that of the bubble-containing layer at the corner portion;
   wherein the thickness of the transparent layer is 2 mm or more and 5 mm or less, and the thickness of the bubble-containing layer is 7 mm or more and 8.5 mm or less at the border between the bottom portion and the corner portion;
   wherein the bubble-containing layer consists of two or more bubble-containing layers having different bubbles content rates from each other, without any other intervening layer, wherein the bubble content rate of each bubble-containing layer is 0.2% or more and 1% or less; and wherein the bubble content rate of the transparent layer in the center of the bottom portion ($B_B$) is 0.01% or less, that at the border between the bottom portion and the corner portion ($B_{BR}$) is less than 0.2%, and that in the upper half of the straight body portion ($B_W$) is 0.1% or less, wherein $B_{BR} > B_W > B_B$.

2. The vitreous silica crucible of claim 1, wherein an average diameter of bubbles contained in the transparent layer is less than 100 μm.

3. The vitreous silica crucible of claim 1, wherein an average diameter of bubbles contained in the bubble-containing layer is 20 μm or more and 200 μm or less.

4. The vitreous silica crucible of claim 1, wherein the volume expansion rate, after 24-hour heat treatment at 1500 degrees C., at an intermediate position between the upper end and the lower end of the straight body portion of the vitreous silica crucible is 3% or less.

5. The vitreous silica crucible of claim 1, wherein the transparent layer is thicker than the bubble-containing layer at the intermediate position of the crucible.

* * * * *